US010434642B2

(12) United States Patent
Lei et al.

(10) Patent No.: US 10,434,642 B2
(45) Date of Patent: Oct. 8, 2019

(54) MECHANICAL ARM AND OPERATION METHOD THEREOF, MECHANICAL ARM DEVICE AND MANUFACTURING EQUIPMENT FOR DISPLAY PANEL

(71) Applicants: BOE Technology Group Co., Ltd., Beijing (CN); Hefei Xinsheng Optoelectronics Technology Co., Ltd., Hefei (CN)

(72) Inventors: Aihua Lei, Beijing (CN); Erqing Zhu, Beijing (CN); Jun Zhang, Beijing (CN); Wei Shang, Beijing (CN)

(73) Assignees: BOE Technology Group Co., Ltd., Beijing (CN); Hefei Xinsheng Optoelectronics Technology Co., Ltd., Anhui (CN)

( * ) Notice: Subject to any disclaimer, the term of this patent is extended or adjusted under 35 U.S.C. 154(b) by 0 days.

(21) Appl. No.: 15/827,823

(22) Filed: Nov. 30, 2017

(65) Prior Publication Data
US 2018/0297194 A1    Oct. 18, 2018

(30) Foreign Application Priority Data

Apr. 17, 2017    (CN) .......................... 2017 1 0249786

(51) Int. Cl.
*B25J 9/04* (2006.01)
*B25J 9/10* (2006.01)
(Continued)

(52) U.S. Cl.
CPC ................. *B25J 9/10* (2013.01); *B25J 9/042* (2013.01); *B25J 13/081* (2013.01);
(Continued)

(58) Field of Classification Search
CPC .................................. B25J 9/042; B25J 9/043
See application file for complete search history.

(56) References Cited

U.S. PATENT DOCUMENTS 7,205,742 B2 *   4/2007   Adachi ............. H01L 21/67259
                                                318/567
7,706,919 B2 *   4/2010   Adachi ............. H01L 21/67259
                                                700/245
(Continued)

FOREIGN PATENT DOCUMENTS

AU        2003304309 A1      1/2005
CN         1802736 B          1/2013
(Continued)

OTHER PUBLICATIONS

Nov. 5, 2018—(CN) First Office Action Appn 201710249786.4 with English Translation.

Primary Examiner — Gerald McClain
(74) Attorney, Agent, or Firm — Banner & Witcoff, Ltd.

(57) ABSTRACT

A mechanical arm and an operation method thereof, a mechanical arm device and a manufacturing equipment of a display panel are disclosed. The mechanical arm includes an arm main body, a bearing section and a first driver. The bearing section is arranged at a first end of the arm main body, and is movably connected with the first end of the arm main body, the bearing section includes a first bearing surface; and the first driver is arranged at the first end of the arm main body, and is connected with the bearing section to drive the bearing section at least to rotate parallel to the first bearing surface.

17 Claims, 11 Drawing Sheets

(51) Int. Cl.
  *B25J 18/00* (2006.01)
  *B25J 15/00* (2006.01)
  *B25J 13/08* (2006.01)
  *H01L 21/68* (2006.01)
  *H01L 21/677* (2006.01)

(52) U.S. Cl.
  CPC ........... *B25J 15/0014* (2013.01); *B25J 18/00* (2013.01); *H01L 21/67766* (2013.01); *H01L 21/68* (2013.01)

(56) References Cited

U.S. PATENT DOCUMENTS

| | | | |
|---|---|---|---|
| 8,112,177 B2 * | 2/2012 | Adachi | H01L 21/681 414/394 |
| 2007/0065144 A1 * | 3/2007 | Hofmeister | H01L 21/67259 396/611 |
| 2011/0118873 A1 * | 5/2011 | Hashimoto | B25J 9/1692 700/245 |
| 2013/0170935 A1 | 7/2013 | Kato et al. | |
| 2014/0140801 A1 * | 5/2014 | Sueyoshi | B25J 9/042 414/744.6 |
| 2016/0133502 A1 * | 5/2016 | Won | H01L 21/68707 700/253 |
| 2016/0247707 A1 | 8/2016 | Hashimoto | |
| 2016/0318182 A1 * | 11/2016 | Nakaya | B25J 9/163 |

FOREIGN PATENT DOCUMENTS

| | | | |
|---|---|---|---|
| CN | 202726892 U | | 2/2013 |
| CN | 102985231 A | | 3/2013 |
| CN | 103189168 A | | 7/2013 |
| CN | 103824791 A | | 5/2014 |
| CN | 105417066 A | * | 3/2016 |
| CN | 105417066 A | | 3/2016 |
| CN | 105579203 A | | 5/2016 |
| EP | 2308657 A1 | | 4/2011 |
| JP | H09162257 A | | 6/1997 |

* cited by examiner

MECHANICAL ARM AND OPERATION METHOD THEREOF, MECHANICAL ARM DEVICE AND MANUFACTURING EQUIPMENT FOR DISPLAY PANEL

The present application claims priority to the Chinese patent application No. 201710249786.4, filed Apr. 17, 2017, the entire disclosure of which is incorporated herein by reference as part of the present application.

TECHNICAL FIELD

Embodiments of the present disclosure relate to a mechanical arm and an operation method thereof, a mechanical arm device and a manufacturing equipment for display panel.

BACKGROUND

With the development of the display technology, flat display devices, such as liquid crystal display (LCD), organic light emitting diode (OLED) display, have become the mainstream display devices because of the advantages such as high display quality, power saving, thin profile, wide application, and so on. At present, in the manufacturing process of a display panel, every stage (e.g., production stage, testing stage or the like) needs a mechanical arm to move a plate-like object, such as a glass substrate, a display master plate or a separated display panel, between different bases, between a base and a transmission device or between different transmission devices, that is, the mechanical arm is needed to pick up the plate-like object from a base or a transmission device or put down the plate-like object on the base or the transmission device. In the process of picking up or putting down the plate-like object, when there occurs a relative position offset between the plate-like object and the base or the transmission device, the plate-like object may collide with the base or the two side edges of the transmission device, resulting in breakage of the plate-like object, increasing the rejection rate and reducing the production capacity.

SUMMARY

At least one embodiment of the present disclosure provides a mechanical arm, the mechanical arm comprises an arm main body, a bearing section and a first driver; the bearing section is arranged at a first end of the arm main body, and is movably connected with the first end of the arm main body, the bearing section comprises a first bearing surface; and the first driver is arranged at the first end of the arm main body, and is connected with the bearing section to be able to drive the bearing section at least to rotate parallel to the first bearing surface.

For example, at least one embodiment of the present disclosure provides a mechanical arm, the mechanical arm further comprises a second driver, and the second driver is arranged at a second end of the arm main body to be able to drive the arm main body and the bearing section to move.

For example, in the mechanical arm provided by at least one embodiment of the present disclosure, the arm main body comprises a first arm and a second arm, the first arm comprises a third end and the first end, the second arm comprises a fourth end and the second end, and the third end of the first arm is movably connected with the fourth end of the second arm.

For example, at least one embodiment of the present disclosure provides a mechanical arm, the mechanical arm further comprises a first transmission, and the first transmission is connected with the second drive member in a transmission connection to drive the first arm to move.

For example, at least one embodiment of the present disclosure provides a mechanical arm, the mechanical arm further comprises a third driver, the third driver is arranged on the second arm, and is configured to drive the first arm to move.

For example, in the mechanical arm provided by at least one embodiment of the present disclosure, the bearing section comprises a main body and a plurality of branch fork rods that are arranged on the main body, the main body is movably connected with the first end, and the plurality of branch fork rods are arranged parallel to the first bearing surface.

For example, in the mechanical arm provided by at least one embodiment of the present disclosure, the bearing section further comprises an alignment device, the alignment device is configured to detect an offset of a plate-like object loaded on the first bearing surface.

For example, in the mechanical arm provided by at least one embodiment of the present disclosure, the alignment device comprises a first sensor and a second sensor, the first sensor and the second sensor are arranged on different branch fork rods respectively, and a connection line between the first sensor and the second sensor is perpendicular to an extension direction of the branch fork rods.

For example, in the mechanical arm provided by at least one embodiment of the present disclosure, the first driver comprises a power member, and an output terminal of the power member is connected to the bearing section in a transmission connection.

At least one embodiment of the present disclosure provides an operation method for the mechanical arm according to any one of the above mentioned mechanical arms, the operation method comprises: moving the bearing section to a base on which a plate-like object is placed; rotating the bearing section to allow the bearing section to be aligned with the plate-like object; and picking up the plate-like object.

For example, in an operation method provided by at least one embodiment of the present disclosure, the first driver drives the bearing section to rotate at least parallel to the first bearing surface to allow the bearing section to be aligned with the plate-like object.

At least one embodiment of the present disclosure provides an operation method for the mechanical arm according to any one of the above mentioned mechanical arms, the operation method comprises: moving the bearing section loaded with a plate-like object to a base; rotating the bearing section to allow the bearing section to be aligned with the base; and putting down the plate-like object.

At least one embodiment of the present disclosure provides a mechanical arm device, the mechanical arm device comprises a base, a controller and a mechanical arm according to any one of the above mentioned mechanical arms, the base is movably connected with the second end of the arm main body; the controller is configured to send a control signal to allow the first driver to drive the bearing section to rotate at least parallel to the first bearing surface.

For example, in the mechanical arm device provided by at least one embodiment of the present disclosure, the mechanical arm device further comprises a fourth driver, the fourth driver is configured to drive the mechanical arm to move up and down, rotate or translate.

At least one embodiment of the present disclosure provides a manufacturing equipment for display panel; the manufacturing equipment comprises a mechanical arm according to any one of above mentioned mechanical arms to allow a plate-like object to move.

It is understood is that the above summary and the following detailed descriptions are illustrative and explanatory to further illustrate the required disclosure.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1A:
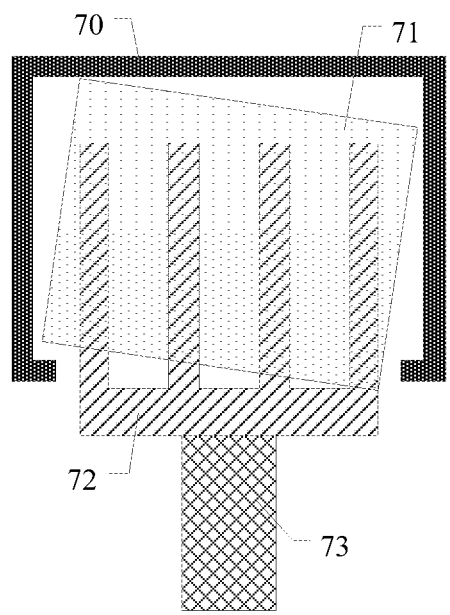
FIG. 1a is a schematic diagram of a mechanical arm moving a substrate.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

The accompanying drawings involve only the structure(s) in connection with the embodiment(s) of the present disclosure, and other structure(s) can be referred to common design(s). For the purpose of clarity only, in accompanying drawings for illustrating the embodiment(s) of the present disclosure, the thickness and size of a layer or a structure may be enlarged. In case of no conflict, features in one embodiment or in different embodiments can be combined.

At present, in the process of picking up or putting down a substrate, the acceleration speed due to the action of picking up or putting down performed by the mechanical arm is limited by the rated load of the drive motor of the mechanical arm, when the max acceleration is arrived, the speed of picking up or putting down reaches the bottleneck, and the speed cannot be further accelerated. On the other hand, when there occurs a relative position offset between the substrate and a base or a transmission device (e.g., an abnormal situation, such as an offset or tilt of the substrate), or there is a relative position offset between the mechanical arm and the base or the transmission device, the substrate possibly collide with the base or two side edges of the transmission devices, resulting in the breakage of the substrate.

FIG. 1a shows a schematic diagram of a mechanical arm moving a substrate. As illustrated in FIG. 1a, a substrate 71 can be placed on a base 70, a mechanical arm comprises an arm 73 and a bearing plate 72, the arm 73 can carry the bearing plate 72 to move, and the bearing plate 72 is used for bearing the substrate 71 thereon to take out the substrate 71 from the base 70 or put down the substrate 71 onto the base 70. When the substrate deviate from the intended position, that is to say, there is a relative position offset between the substrate 71 and the base 70, the mechanical arm cannot adjust the relative position between itself and the base 70 automatically or cannot adjust the relative position between substrate 71 and the base 70 either, thus in the process of picking up or putting down the substrate 71, the substrate 71 that is loaded on the bearing plate 72 is prone to collide with the edges of the two sides (e.g., side walls) of the base 71, resulting in the breakage of the substrate 71, increasing the rejection rate and reducing the production capacity. In addition, if a detection device is arranged on the mechanical arm, and there is a relative position offset between the substrate 71 and the base 70, the detection device can send out an alarm signal to remind an operator to adjust the posture of the substrate 71, or take out or put down the substrate 71 by hand, therefore lowering the utilization rate of the equipment with the mechanical arm, wasting manpower, and reducing production efficiency.

At least one embodiment of the present disclosure provides a mechanical arm; the mechanical arm comprises an arm main body, a bearing section and a first driver. The bearing section is arranged at a first end of the arm main body, and is movably connected with the first end of the arm main body, and the bearing section comprises a first bearing surface; and the first driver is arranged at the first end of the arm main body, and is connected with the bearing section to be able to drive the bearing section at least to rotate parallel to the first bearing surface. The first driver is specifically arranged on the bearing section of the mechanical arm, the first driver can drive the bearing section rotate freely to realize the automatic alignment between the bearing section and the plate, reducing fragmentation ratio, improving the speed of picking up or putting down the substrate, saving production time, improving production capacity, reducing production halt, improving the utilization rate of the equipment using the mechanical arm, and improving production efficiency.

Several embodiments of the disclosure will be described in detail in connection with the accompanying drawings, but the disclosure is not limited to these specific embodiments. The plate-like objects, such as a glass substrate, a display master and a separated display panel are taken as examples to illustrate in the following description, but the embodiments of the disclosure are not limited to above mentioned plates.

It should be noted that in the description of the embodiments of the disclosure, the phrase "movable connection" or "movably connected" refers to the case in which two components that connected together can move relatively, such as move parallel to each other and/or rotate relatively.

Embodiment 1

Figure 2A:
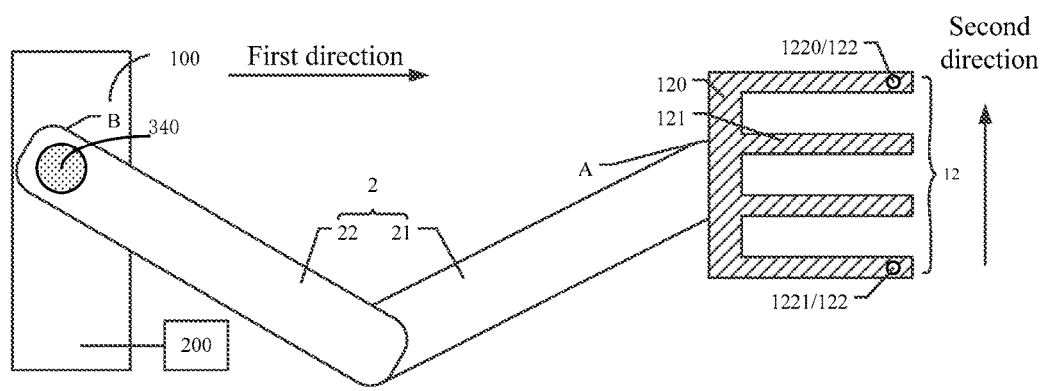
FIG. 2a is a plane schematic diagram of the mechanical arm in an embodiment of the present disclosure.
Figure 2D:
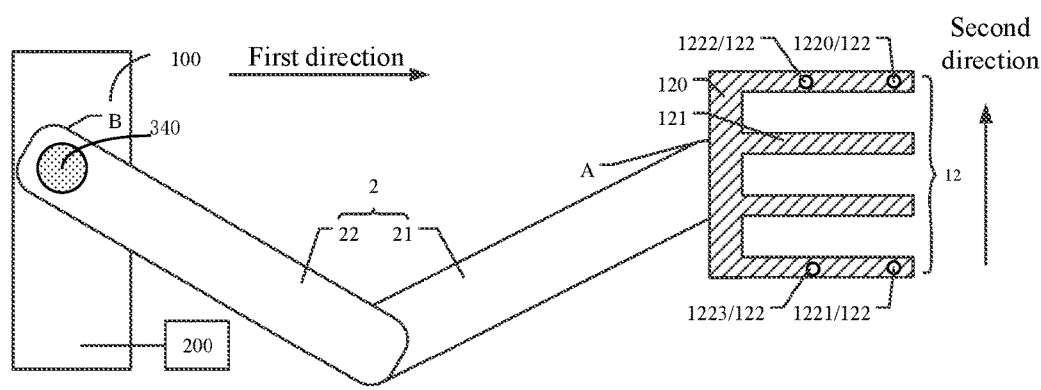
FIG. 2d is a plane schematic diagram of the mechanical arm in an embodiment of the present disclosure.
Figure 2B:
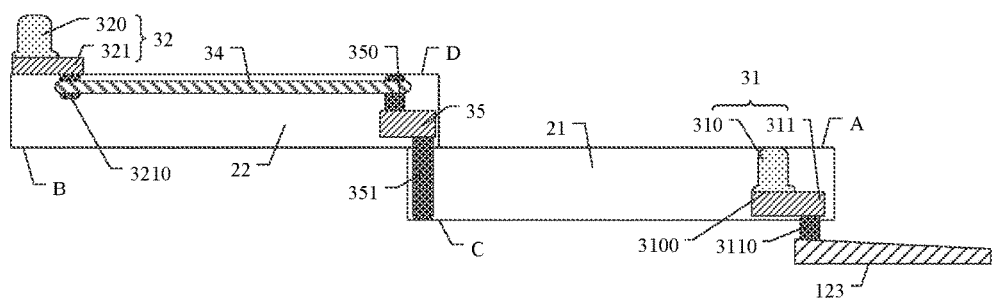
FIG. 2b is a section structure schematic diagram of the mechanical arm in an embodiment of the present disclosure.
Figure 2C:
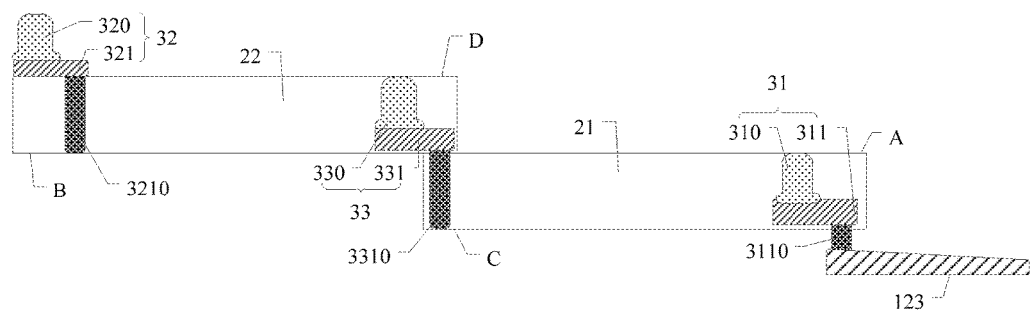
FIG. 2c is a section structure schematic diagram of another mechanical arm in an embodiment of the present disclosure.

This embodiment of the disclosure provides a mechanical arm. FIG. 2a shows a plane schematic diagram of a mechanical arm in this embodiment; FIG. 2b shows a sectional structure schematic diagram of the mechanical arm in this embodiment; and FIG. 2c shows a sectional structure schematic diagram of another mechanical arm in this embodiment.

For example, as illustrated in FIG. 2a and FIG. 2b, the mechanical arm comprises an arm main body 2, a bearing section 12, and a first driver 31. The bearing section 12 is arranged at a first end A of the arm main body 2, and is movably connected with the first end A of the arm main body 2, and the bearing section 12 comprises a first bearing surface 123; and the first driver 31 is arranged at the first end A of the arm main body 2, and is connected with the bearing section 12 to be able to drive the bearing section 12 at least to rotate parallel to the first bearing surface 123.

For example, the combination between the bearing section 12 and the first end A of the arm main body 2 can be one or any combination of gear connection, sliding connection, rotating connection, and so on to allow the bearing section 12 to move relatively to the arm main body 2.

For example, the first driver 31 can also drive the bearing section 12 to move in the direction perpendicular to the first bearing surface 123 to put down or pick up a plate-like object.

For example, as illustrated in FIG. 2b, the first driver 31 can comprise a first power member 310, and the power output terminal 3100 of the first power member can be connected to the bearing section 12 in a transmission connection.

For example, the transmission connection can comprise friction transmission, meshing transmission, pneumatic transmission, hydraulic transmission, coupling transmission and so on. For example, friction transmission can comprise friction wheel transmission, belt transmission and so on; meshing transmission can comprise gear transmission, turbo worm transmission, chain transmission and so on.

For example, the first driver 31 can further comprise a second transmission 311, the first power member 310 is connected with the bearing section 12 via the second transmission 311, the second transmission 311 can match rotation speeds, adjust torques, change the transmission ratio to match the power transmission ratio between the first power member 310 and the bearing section 12, and to meet the power requirement of the bearing member 12. For example, an input axis (not shown) of the second transmission 311 is connected with the power output terminal 3100 of the first power member 310, and the output axis 3110 of the second transmission 311 is connected with the bearing section 12.

For example, the first power member 310 can be one or any combination of motor, pneumatic power member and hydraulic power member. For example, the first power member 310 can use a stepper motor or a servo motor to achieve precise control. For example, when the first power member 310 is a hydraulic power member, the mechanical energy (such as torque and rotation speed) can be adjusted by adjusting the liquid pressure in the hydraulic pump of the hydraulic power member so as to be able to drive the bearing section 12 to move.

For example, the second transmission 311 can be a gear transmission, a worm gear transmission, a hydraulic mechanical transmission, a planetary gear transmission and so on. The gear transmission, for example, can be a cylindrical gear transmission, a bevel gear transmission, and so on.

As illustrated in FIG. 2b, for example, the arm main body 2 can comprise a first arm 21 and a second arm 22, the first arm 21 comprises a third end C and a first end A, the second arm 22 comprises a fourth end D and a second end B, and the third end C of the first arm 21 is movably connected with the fourth end D of the second arm 22. The second end B of the second arm 22, for example, is arranged on the base 100. The third end C of the first arm 21 is connected with the fourth end D of the second arm 22 in a way such as one or any combination of gear connection, sliding connection, rotational connection and so on, as long as relative movement and power transmission can be performed between the first arm 21 and the second arm 22 to allow the first arm 21 and the second arm 22 to move in cooperation with each other. For example, the first arm 21 can be connected with the second arm 22 by way of a moving pair, a shaft and so on to realize relative rotation, and the moving pair comprises a rotation pair, a helical pair and so on, and the shaft comprises a rotating shaft, a transmission shaft and so on.

For example, the shape of the first arm 21 and the second arm 22 can be in a cylinder shape, a cuboid shape, a trapezoid shape and so on. The shape of the first arm 21 and the second arm 22 can be the same as or different from each other. For example, the shapes of both the first arm 21 and the second arm 22 can be cuboid shapes.

It should be noted that the arm main body 2 is not limited to comprise two arms only. For example, the arm main body 2 can further comprise a third arm and a fourth arm, the arms can be movably connected with one another, the third arm and the fourth arm can expand the range of movement of the arm main body 2 to adapt to the base or the transmission device in different dimensions. For example, each arm of the arm main body 2 can be disassembled and assembled, when the mechanical arm carries a plate-like object in a large range of movement, the arm main body 2 can be provided with a plurality of arms, and when the mechanical arm carries a plate-like object in a small range of movement, the arm main body 2 can be provided with only the first arm 21 and the second arm 22 to reduce driving load and power consumption.

For example, as illustrated in FIG. 2a, the bearing section 12 can comprise a main body 120 and a plurality of branch fork rods 121 that are arranged on the main body 120, and the branch fork rods 121 are arranged at an interval. The main body 120 is movably connected with the first end A, the bearing section 12, for example, can comprise four branch fork rods 121, and the four branch fork rods 121 can be arranged parallel to the first bearing surface 123, and the four branch fork rods 121 can be distributed uniformly on the main body 120. For example, the bearing section 12 can also be in a plate shape, that is, the bearing section 12 can only comprise one branch fork rod 121. In the direction perpendicular to the extending direction of the branch fork rod 121, i.e., in a second direction, the length of the branch fork rod 121 and the main body 120, for example, can be approximately equal to each other.

For example, on the first bearing surface 123, an orthographic projection of the branch fork rod 121 can be in a shape, such as a rectangular shape, a trapezoidal shape, a zigzag shape, a wavy shape and so on, and an orthographic projection of the main body 120 can be in a shape, such as a rectangular shape, an arched shape, a crescent shape and so on. It should be noted that the number and the shape of the branch fork rod 121 and the shape of the main body 120 are not limited to the situation as illustrated in FIG. 2a or not limited to above mentioned examples, the branch fork rod 121 and the main body 120 can be arranged flexibly according to the specific situations.

For example, the main body 120 and the branch fork rod 121 can be integrally formed, or the main body 120 and the branch fork rod 121 can be fixedly connected by bonding, welding, key pin connecting, riveting and so on. Welding, for example, can be fusion welding, pressure welding or brazing, also can be electron beam welding, plasma welding, ultrasonic welding and so on. The present disclosure does not limit the fixed connection manner between the main body 120 and the branch fork rod 121.

For example, the materials of the main body 120 and the branch fork rod 121 can comprise stainless steel, and the exterior of main body 120 and the branch fork rod 121 can be wrapped with an insulation layer to ensure the strength of the bearing section 12, and at the same time reduce the influence of electrostatics on the plate-like object, and thus ensure the quality of plate-like object; when the insulation layer is made of a flexible material, the insulation layer can also have the function of cushion to prevent the plate-like object from being damaged. For example, the material of the insulating layer can comprise organic insulating material, inorganic insulation material and so on, and the organic insulating material, for example, can be resin, rubber, shellac and so on. It should be noted that the materials of the main body 120 and the branch fork rod 121 are not limited to the above mentioned materials.

For example, when carrying the plate-like object, the first bearing surface 123 of the bearing section 12 is used for bearing the plate-like object thereon, a vacuum adsorption device, for example, a plurality of suckers, can also be arranged on the first bearing surface 123, the suckers are configured to absorb the plate-like object when the plate-like object are carried so as to prevent the plate-like object from falling from the bearing section 12, or prevent the plate-like object displacing when being carried. For example, the suckers can be made of rubber or another flexible material to ensure the absorbability and prevent the surface of the plate-like object from being scratched when the plate-like object are absorbed. It should be noted that the number and the structure of the suckers can be flexibly selected according to the size and the materials of the bearing section 12 and the carried plate-like object, and the embodiments do not limit the number and the structure of the suckers.

For example, the bearing section 12 can further comprise an alignment device 122, the alignment device 122 is configured to detect a position offset of a plate-like object loaded on the first bearing surface 123.

Figure 1B:
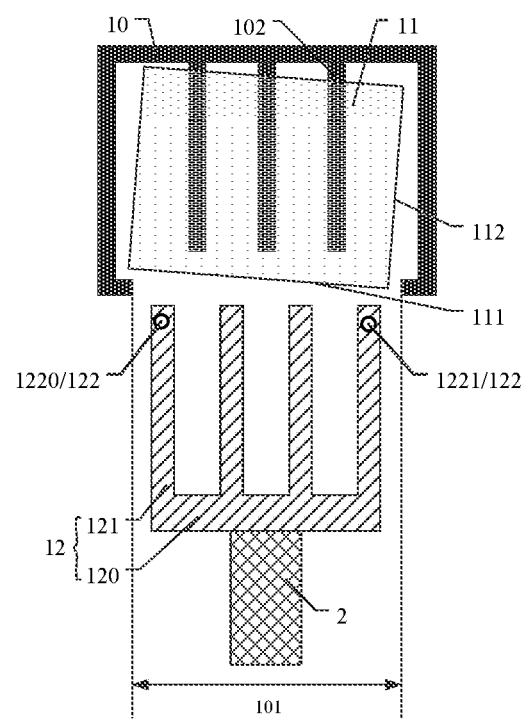
FIG. 1b is a schematic diagram of the bearing section beyond edges of the plate-like object in an embodiment of the present disclosure.

As illustrated in FIG. 2a, for example, the alignment device 122 can comprise a first sensor 1220 and a second sensor 1221. The first sensor 1220 and the second sensor 1221 can be arranged on different branch fork rods 121, for example, the first sensor 1220 and the second sensor 1221 can be respectively arranged on two branch fork rods 121 that are farthest apart, and a connection line between the first sensor 1220 and the second sensor 1221 is perpendicular to an extension direction of the branch fork rods 121. When there is a relative position offset between the plate-like object and the base, and the mechanical arm is moved to enter the base, as illustrated in FIG. 1b, the first sensor 1220 and the second sensor 1221 cannot detect the plate-like object at the same time, thus through the difference between the time when the first sensor 1220 detects the plate-like object and the time when the second sensor 1221 detects the plate-like object, such as a first side 111, facing the bearing section 12, of the rectangular plate (plate-like object), then the offset angle of the plate-like object can be calculated, the first driver 31 drives the bearing section 12 to rotate parallel to the first bearing surface 123 by the corresponding offset angle to allow the bearing section 12 to be aligned with the plate-like object along a direction perpendicular to the first side 111, that is, a direction parallel to a second side 112.

For example, the first sensor 1220 and the second sensor 1221 can also be arranged on the same branch fork rod 121. A first alignment member and a second alignment member can be arranged on the plate-like object, and the first alignment member and the second alignment member respectively correspond to the first sensor 1220 and the second sensor 1221; when the plate-like object deviates from the intended position, the first alignment member and the second alignment member cannot respectively align with the first sensor 1220 and the second sensor 1221, thus the first driver 31 can drive the bearing section 12 to rotate parallel to the first bearing surface 123; when the first alignment member and the second alignment member are respectively aligned with the first sensor 1220 and the second sensor 1221, it is indicated that the bearing section 12 is aligned with the plate-like object.

For example, the first sensor 1220 and the second sensor 1221 can be resistance sensors, photoelectric sensors, magnetoelectric sensors, semiconductor sensors and so on. The types of the first sensor 1220 and the second sensor 1221 can be the same or different, and this embodiment does not limit the types of the first sensor 1220 and the second sensor 1221.

It should be noted that the alignment device 122 is not limited to comprise two sensors only. The alignment device 122 can further comprise a third sensor, a fourth sensor and so on to detect the position offset of the plate-like object more precisely. The first sensor 1220, the second sensor 1221, the third sensor and the fourth sensor can be arranged on different branch fork rods 121 or arranged on the same branch fork rod 121. For example, as illustrated in FIG. 2d, the first sensor 1220 and the third sensor 1222 are arranged on same one branch fork rod 121, the second sensor 1221 and the fourth sensor 1223 are arranged on same one branch fork rod 121, and this embodiment does not limit the arrangement and the position of each sensor of the alignment device 122.

For example, as illustrated in FIG. 2b, in an example, the mechanical arm can further comprise a second driver 32. The second driver 32 is arranged on the second end B of the arm main body 2 to be able to drive the arm main body 2 and the bearing section 12 to move. For example, the first driver 31 and the second driver 32 can drive the mechanical arm to work at the same time to improve the speed of the mechanical arm to take out or put down the plate-like object, increase production efficiency and improve production capacity.

For example, the second driver 32 can further comprise a second power member 320, and an power output terminal of the second power member 320 is connected with the second end B of the second arm 22 in a transmission connection. The second driver 32 can further comprise a third transmission 321, and the second power member 320 can be connected with the second end B via the third transmission 321 in a transmission connection, the third transmission 321 can match rotation speeds, adjust torques, change the transmission ratio to match the power transmission ratio between the second power member 320 and the arm main body 2, and to meet the power requirement of the arm main body 2. For example, an input axis (not shown) of the third transmission 321 is connected to the power output terminal (not shown) of the second power member 320, and the output axis 3210 of the third transmission 321 is connected to the arm main body 2.

For example, the type of the second power member 320 can be the same as the type of the first power member 310, or different from the type of the first power member 310; the type of the third transmission 321 can be the same as the type of the second transmission 311, or different from the type of the second transmission 311, this embodiment does not limit the types of each power member and each transmission. For example, the first power member 310 and the second power member 311 are both stepping motors or servo motors to realize accurate control; the third transmission 321 and the second transmission 311 are both gear transmissions.

For example, in an example, as illustrated in FIG. 2b, the mechanical arm can further comprise a first transmission 35. The first transmission 35 is connected with the second driver 32 in a transmission connection to drive the first arm 21 to move.

For example, a power input axis 350 of the first transmission 35 can be connected to the power output axis 3210 of the third transmission 321 via a synchronous belt 34, and the power output axis 351 of the first transmission 35 is connected to the first arm 21, therefore the first transmission 35 can transmit the power from the second driver 32 to the first arm 21 to drive the first arm 21 to move, and drive the bearing section 12 to move.

For example, the synchronous belt 34 can be a trapezoidal tooth synchronous belt, an arc tooth synchronous belt and so on. The synchronous belt 34 can be a ring steel wire rope wrapped with a layer of polyurethane or chloroprene rubber to form a ring belt.

It should be noted that, the connection between the power input axis 350 of the first transmission 35 and the output axis 3210 can also be a gear meshing connection, a transmission rod connection and so on, as long as the power transmission can be performed between the second driver 32 and the first transmission 35.

For example, as illustrated in FIGS. 2a and 2b, the first transmission 35 can match the rotation speeds of the first arm 21 and the second arm 32 to drive the bearing section 12 to move in a straight line along the first direction. For example, the first driver can drive the bearing section 12 to rotate parallel to the first bearing surface 123, therefore in the movement process of the arm main body 2, the extending direction of the branch fork rod 121 is the same as the first direction all the time to ensure the bearing section 12 cannot collide with the two sides of the base in the process of the mechanical arm picking up the plate-like object from the base or putting down the plate-like object on the base. It should be noted that, the arm main body 2 can also drive the bearing section 12 to rotate to meet the different actual requirements.

For example, the type of the first transmission 35 can be the same as the type of the second transmission 311, or different from the type of the second transmission 311, the repetition is not described again.

For example, in an example, as illustrated in FIG. 2c, the mechanical arm can further comprise a third driver 33. The third driver 33 is arranged on the second arm 22 or connected with the second arm 22 in a transmission connection, and is configured to drive the first arm 21 to move.

For example, the third driver 33 can comprise a third power member 330, the power output terminal of the third power member 330 is connected with the third end C of the first arm 21 in a transmission connection. The third driver 33 can further comprise a fourth transmission 331, therefore the third power member 330 can be connected with the third end C via the fourth transmission 331, the fourth transmission 331 can match rotation speeds, adjust torque, change the transmission ratio to match the power transmission ratio between the third power member 330 and the first arm 21, and to meet the power requirement of the first arm 21. For example, an input axis (not shown) of the fourth transmission 331 is connected to the power output terminal (not shown) of the third power member 330, and the output axis 3310 of the fourth transmission 331 is connected to the first arm 21.

For example, the type and the structure of the second driver 32 and the third driver 33 can be similar to those of the first driver 31, and are not described in detail here for the purpose of simplicity.

Embodiment 2

The embodiment provides an operation method, and the operation method can be used for operating any one of the above mentioned mechanical arms. FIGS. 3a-3d show flow schematic diagrams of the operation method in the embodiment.

The operation method provided in the embodiment can be used for picking up the plate-like object from the bases or the transmission devices, the embodiment will take the plate-like object arranged on the base as an example to illustrate in detail.

For example, the operation method provided in the embodiment comprises the following steps: moving the bearing section towards a base on which a plate-like object is provided; rotating the bearing section to allow the bearing section to be aligned with the plate-like object; and picking up the plate-like object.

The operation method can use the first driver to drive the bearing section to rotate to realize the automatic alignment between the bearing section and the plate-like object, when the plate-like object is taken out of the base, the method can prevent the plate-like object from colliding with the edges of two sides of the base, and reduce fragmentation ratio, improve the speed of picking up the plate-like object, improve the utilization rate of the equipment with the mechanical arm and improve production efficiency.

In connection with FIGS. 3a-3d, the detailed description of the procedure of the operation method in the present embodiment is given.

Figure 3A:
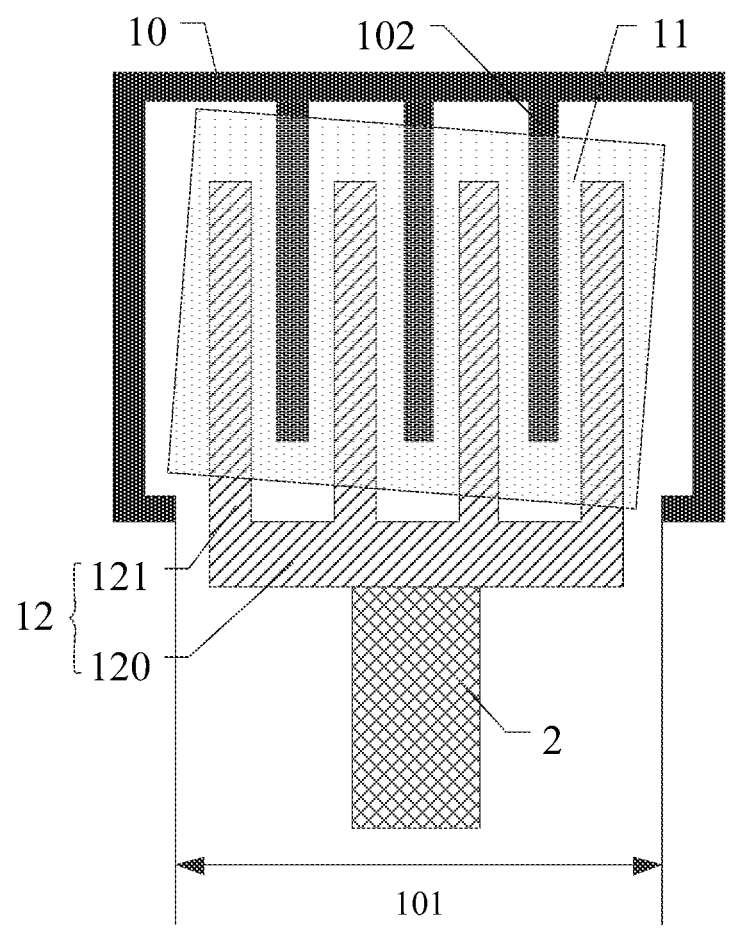
FIG. 3a-3d are flow schematic diagrams of the operation method used for the mechanical arm in an embodiment of the present disclosure.

For example, as illustrated in FIG. 3a, the bearing section 12 is moved into a base 10 on which a plate-like object 11 is placed.

For example, a base exit 101 is arranged on the base 10, the bearing section 12 can stretch into the base 10 from the base exit 101 to take out the plate-like object 11.

For example, the base 10 can further comprise a plurality of projected pillars 102 that are arranged at intervals, the projected pillars 102 are configured for bearing the plate-like object 11, the branch fork rods 121 of the bearing section 12 can stretch into the space between the projected pillars 102 to take up and take out the plate-like object 11.

For example, the plate-like object 11 can be a metal panel or a non-metal panel, the non-metal panel, for example, can be a glass panel, a quartz panel, a ceramic panel, a plastic panel, a silicone panel and so on, for example, the plate-like object 11 can also be a panel on which functional members are formed, such as a liquid crystal display panel, an OLED panel and so on, the metal panel, for example, can be a galvanized steel panel, a hot-dip galvanized steel panel, a galvanized and aluminized steel panel, a purple copper panel and so on.

Figure 3B:
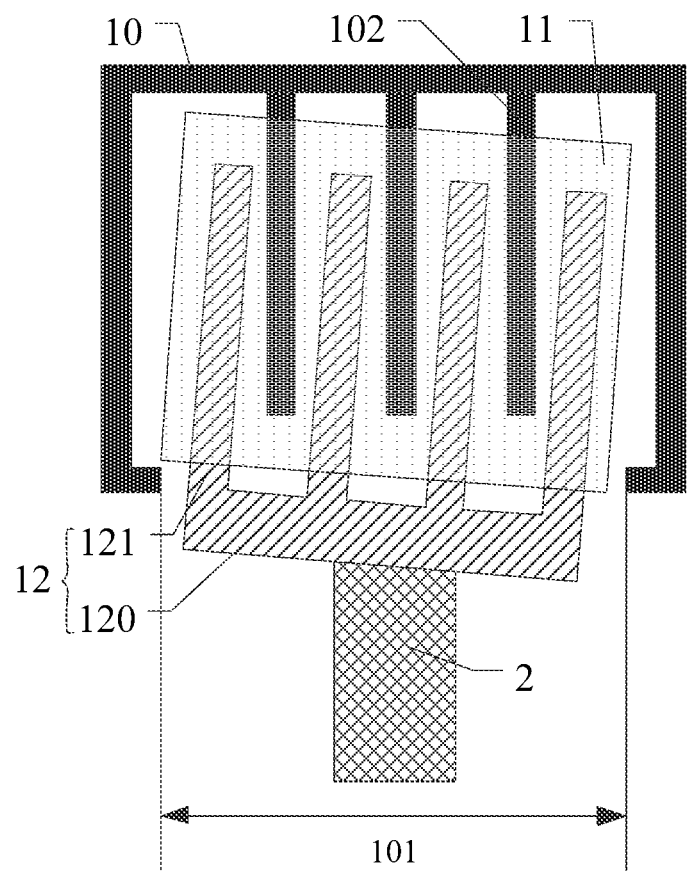

For example, as illustrated in FIG. 3*b*, when there is a relative position offset between the plate-like object 11 and the base 10, the bearing section 12 is rotated to be aligned with the plate-like object 11.

For example, the first driver is employed to drive the bearing section 12 to rotate parallel to the first rearing surface so as to allow the bearing section 12 to be aligned with the plate-like object 11.

For example, the bearing section 12 can rotate in the clockwise direction parallel to the first rearing surface, and the bearing section 12 can also rotate in the counter-clockwise direction to allow the first bearing surface to be aligned with the plate-like object 11.

For example, before the bearing section is driven to rotate, the operation method can further comprise detecting a position offset of the plate-like object. For example, the first sensor and the second sensor of the bearing section 12 can be respectively arranged on the different branch fork rods 121, and the connection line between the first sensor and the second sensor is perpendicular to the extension direction of the branch fork rods. When there is a relative position offset between the plate-like object 11 and the base 10, and the mechanical arm stretches into the base 10, the first sensor and the second sensor cannot detect the plate-like object 11 at the same time, thus the difference between the time when the first sensor detects the plate-like object and the time when the second sensor detects the plate-like object 11, then the offset angle of the plate-like object 11 can be calculated, the first driver drives the bearing section 12 to rotate parallel to the first bearing surface to the corresponding offset angle to allow the bearing section 12 to be aligned with the plate-like object 11.

It should be noted that an alignment member corresponding to the alignment device of the bearing section 12 can be arranged on the plate-like object 11. For example, a first alignment member and a second alignment member respectively corresponding to the first sensor and the second sensor can be arranged on the plate-like object 11, when the plate-like object 11 deviates from the intended position, the first alignment member and the second alignment member cannot be aligned with the first sensor and the second sensor, therefore the first driver can drive the bearing section 12 to rotate parallel to the first bearing surface, when the first alignment member and the second alignment member are aligned respectively with the first sensor and the second sensor, indicating that the bearing section 12 is aligned with the plate-like object 11.

Figure 3C:
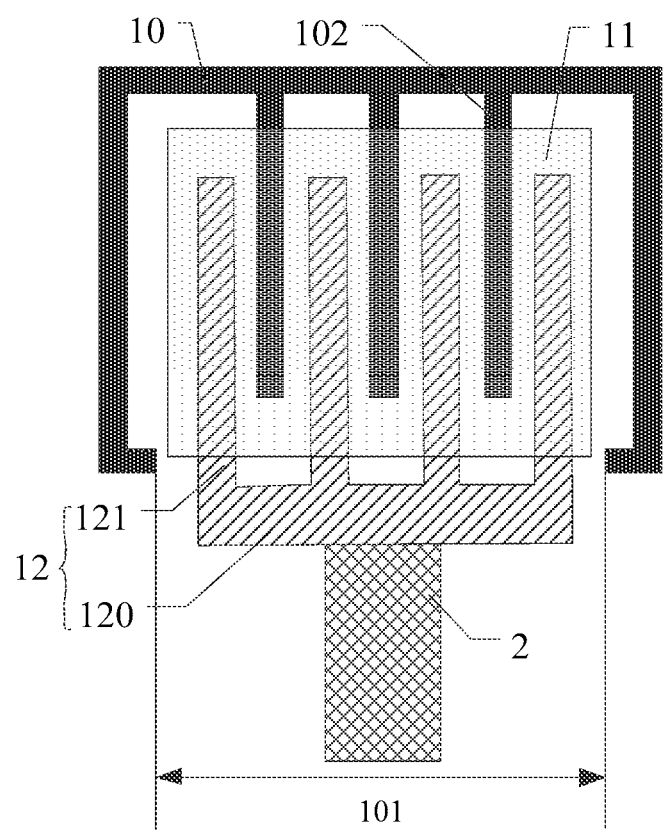

For example, as illustrated in FIG. 3*c*, the bearing section 12 is rotated to allow the bearing section 12 to be aligned with the base 10.

For example, the first driver drives the bearing section 12 to rotate parallel to the first bearing surface to allow the bearing section 12 to be aligned with the base 10.

For example, in the step as illustrated in FIG. 3*c*, the rotation direction of the bearing section 12 can be opposite to the rotation direction of the bearing section 12 in the step as illustrated in FIG. 3*b*. For example, in the step as illustrated in FIG. 3*b*, when the bearing section 12 rotates in the clockwise direction parallel to the first rearing surface, in the step illustrated in FIG. 3*c*, the bearing section rotates in the counter-clockwise direction parallel to the first rearing surface to the same angle to allow the bearing surface 12 to be aligned with the base 10. It should be noted that in the above description, the reference of the rotation direction and the rotation angle of the bearing section 12 can be the base 10.

For example, an alignment member corresponding to the alignment device of the bearing section 12 can be arranged on the base 10, therefore the first driver can drive the bearing section 12 to rotate to allow the alignment device of the bearing section 12 to be aligned with the alignment member on the base 10, and therefore allow the bearing section 12 to be aligned with the base 10.

Figure 3D:
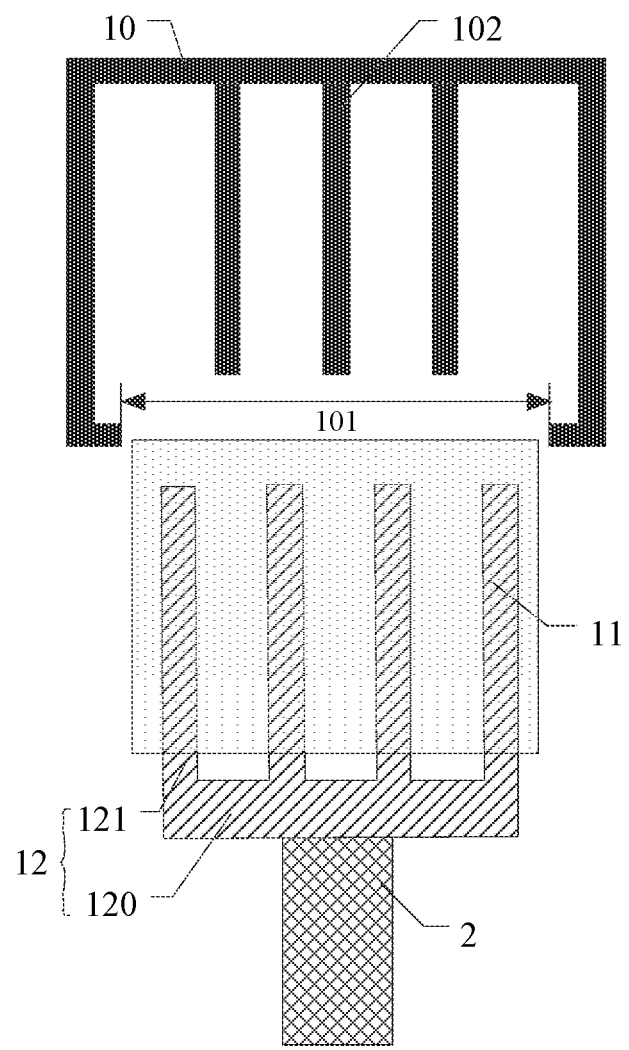

For example, as illustrated in FIG. 3*d*, the plate-like object 11 is picked up.

For example, the first driver drives the bearing section 12 to move perpendicular to the first bearing surface in a direction away from the base to allow the first bearing surface to bear the plate-like object 11; then the second driver drives the arm main body 2 and the bearing section 12 to move to take out the plate-like object 11 from the base 10, and subsequently a treatment can be performed on the plate-like object 11.

Embodiment 3

The embodiment provides an operation method, and the operation method can be used for operating any one of the above mentioned mechanical arms. FIGS. 4*a*-4*d* show flow schematic diagrams of the operation method in the embodiment.

The difference between the embodiment 2 and the present embodiment lies in that the operation method provided in this embodiment can be used for putting down a plate-like object on a base or a transmission device, this embodiment will take the operation of arranging the plate-like object on the base as an example to illustrate in detail.

For example, the operation method provided in the embodiment comprises the following steps: moving the bearing section loaded with a plate-like object thereon to a base; rotating the bearing section to allow the bearing section to be aligned with the base; and putting down the plate-like object.

In connection with FIGS. 4*a*-4*d*, a detailed description of the procedure of the operation method in the present embodiment is given.

Figure 4A:
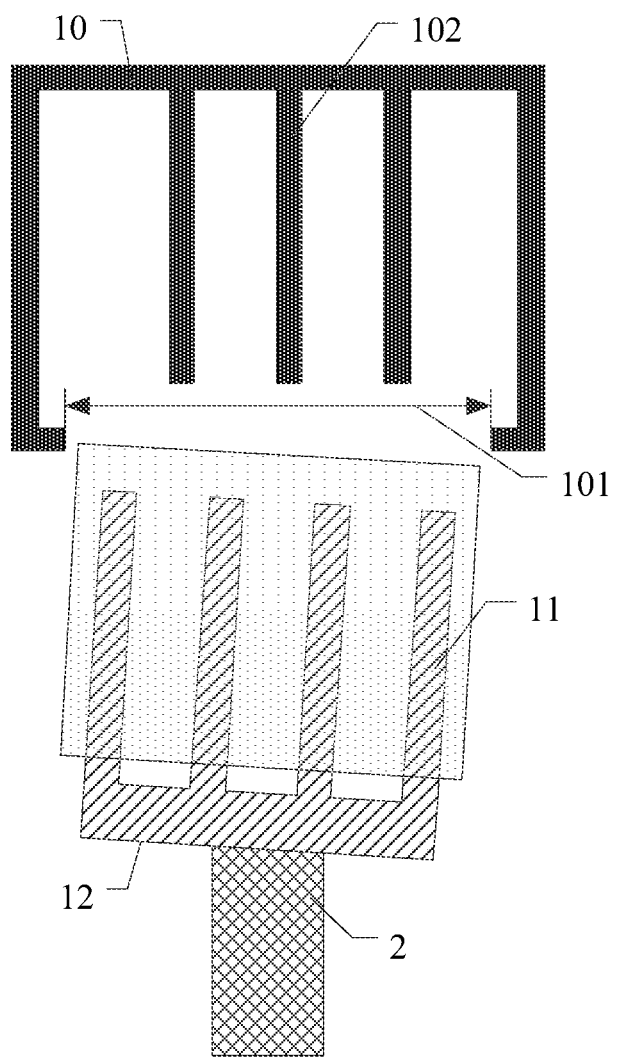
FIG. 4a-4d are flow schematic diagrams of another operation method used for the mechanical arm in an embodiment of the present disclosure.

For example, as illustrated in FIG. 4*a*, the bearing section 12 loaded with a plate-like object 11 is moved towards a base 10.

Figure 4B:
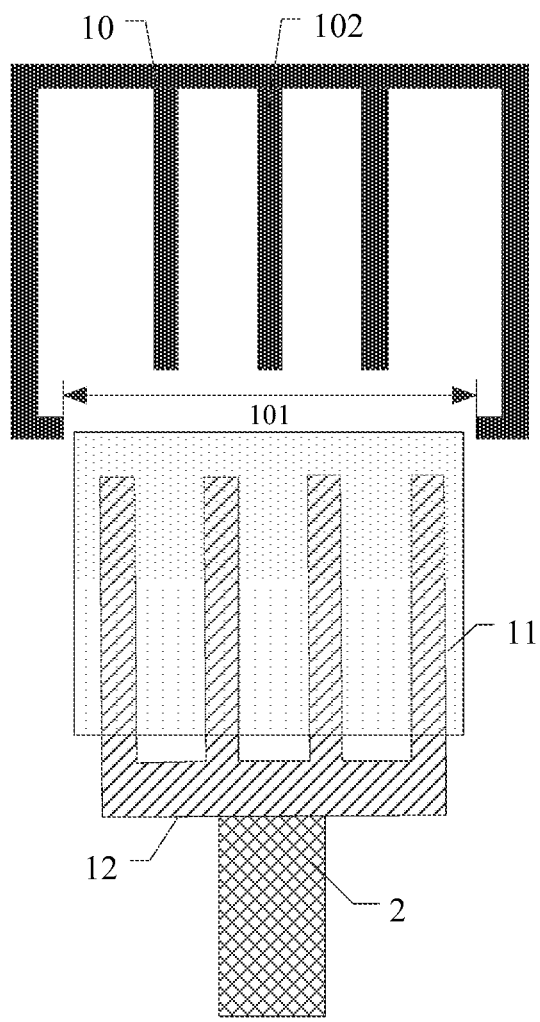

For example, as illustrated in FIG. 4*b*, when there is a relative position offset between the plate-like object 11 and the base 10, the bearing section 12 is rotated to be aligned with the base 10.

It should be noted that in the movement of the plate-like object 11, when the plate-like object 11 deviates from the intended position to the bearing section 12, that is, when the bearing section 12 moves to the base 10, there is no relative position offset between the bearing section 12 and the base 10, but there is a relative position offset between the plate-like object 11 and the base 10, therefore the bearing section 12 can be rotated to allow the plate-like object 11 to be aligned with the base 10.

Figure 4C:
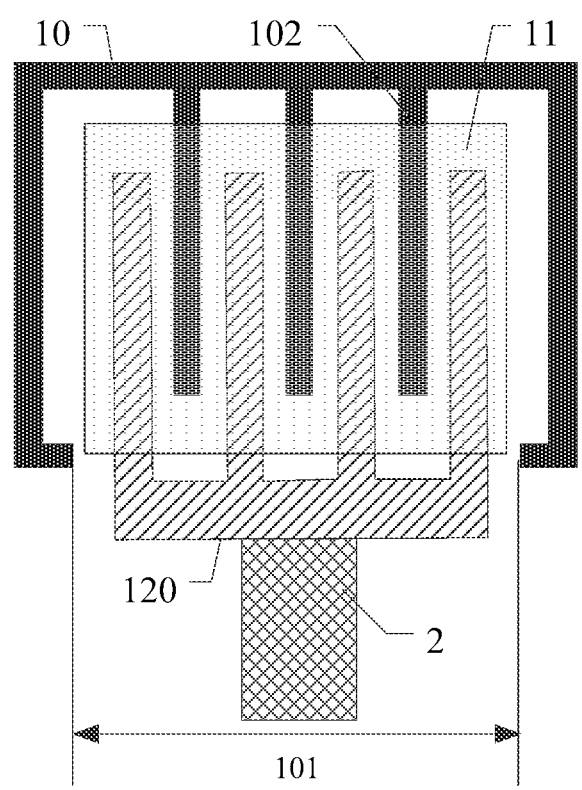

For example, as illustrated in FIG. 4c, the bearing section 12 loaded with the plate-like object 11 is stretched into the base 10, and the plate-like object is put down.

Figure 4D:
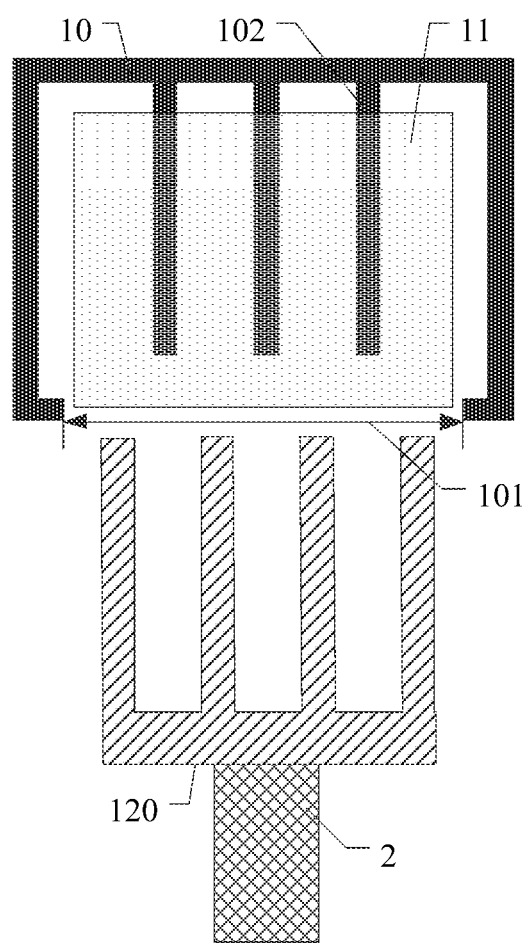

For example, as illustrated in FIG. 4d, the bearing section 12 is moved out of the base 10.

The operation method provided in the embodiment can refer to the relative description in the embodiment 2, and the repetition is not described again.

Embodiment 4

The embodiment provides a mechanical arm device. For example, as illustrated in FIG. 2a, the mechanical arm device provided in this embodiment comprises a base 100, a controller 200 and a mechanical arm according to any one of the mechanical arms provided in the embodiments of the present disclosure. The base 100 is movably connected with the second end of the arm main body; the controller 200 is configured to send a control signal to allow the first driver to drive the bearing section to rotate at least parallel to the first bearing surface.

For example, the connection between the base 100 and the second end B of the arm main body 2 can be a sliding connection or a rotating connection, as long as the base 100 can move relatively to the arm main body 2.

For example, the controller 200 is further configured to send control signals to the second driver and the third driver to drive the arm main body 2 to move.

For example, the controller 200 can be a single chip computer, a programmable logic controller (PLC), a central processing unit (CPU) and so on, and the controller 200 can be connected to a peripheral device, such as an operation panel, a touch control panel, a display panel, etc.

For example, the mechanical arm device can further comprise a fourth driver 340 as illustrated in FIG. 2a. The fourth driver is configured to drive the mechanical arm to move up and down, rotate or translate to drive the plate-like object to move between different bases, between a base and a transmission device or between different transmission devices. The controller 200 can also send control signals to the fourth driver to drive the whole mechanical arm to move.

For example, the fourth driver can be connected to the mechanical arm in a transmission connection to drive the whole mechanical arm to move. For example, the fourth driver can further comprise a fourth power member, a fifth power member, and so on, the power output terminal of the fourth power member can be connected to the mechanical arm via a fifth transmission in a transmission connection, the fifth transmission can adjust rotation speeds, adjust torques, change the transmission ratio to match the power transmission ratio between the fourth power member and the mechanical arm, and to meet the power requirement of the mechanical arm. For example, the fourth power member can also be connected to the base 100 in a transmission connection to drive the base 100 to move up and down, rotate or translate, because the mechanical arm is arranged on the base 100, the base 100 can drive the mechanical arm to move. The embodiment is not limited to this.

The type and the structure of the fourth driver 340 can be similar to those of the first driver 31, and are not described in detail here for the purpose of simplicity For example, the mechanical arm device can further comprise a power supply, the power supply is employed for providing electrical power to every module or unit of the mechanical arm under the control of the controller 200. The power supply, for example, can be an external direct-current power, an external alternating-current power or a battery, for example, a primary battery or a secondary battery.

Embodiment 5

The present embodiment provides a manufacturing equipment for display panel, the equipment comprises a mechanical arm according to any one of the mechanical arms provided in the embodiments of the present disclosure, and the mechanical arm is used to transfer a plate-like object. The manufacturing equipment for display panel can automatically align the bearing section with the plate-like object, or align the bearing section with the bases to prevent the plate-like object from colliding with the edges of two sides of the base, and reduce fragmentation rate, improve the utilization rate of the manufacturing equipment and improve production capacity.

For example, the manufacturing equipment for display panel can be used for manufacturing a liquid crystal display panel, an OLED display panel and so on.

It should be noted that in the embodiments of the present disclosure, the phrase "there is no relative position offset between the bearing section and the base" or the like represents that in the process of the bearing section moving into the base or moving out of the base, the bearing section does not collide with the base. The phrase that "there is no relative position offset between the plate-like object and the base" or the like represents that in the process of the plate-like object being taken out of the base or put on the base, the plate-like object does not collide with the base.

What are described above is related to the specific embodiments of the disclosure only and not limitative to the scope of the disclosure. The protection scope of the disclosure shall be based on the protection scope of the claims.

What is claimed is:

1. A mechanical arm, comprising:
   an arm main body, a bearing section, and a first driver,
   wherein the bearing section is arranged at a first end of the arm main body, and is movably connected with the first end of the arm main body, the bearing section comprises a first bearing surface;
   wherein the first driver is arranged at the first end of the arm main body, and is connected with the bearing section to be able to drive the bearing section at least to rotate parallel to the first bearing surface;
   wherein the bearing section further comprises an alignment device, the alignment device is configured to detect an offset of a rectangular plate loaded on the first bearing surface;
   wherein the alignment device comprises a first sensor and a second sensor, the first sensor and the second sensor are arranged on respective branch fork rods, and a connection line between the first sensor and the second sensor is perpendicular to an extension direction of the branch fork rods;
   wherein the first driver comprises a first power member, and an output terminal of the first power member is connected to the bearing section in a transmission connection; and wherein the first driver further comprises a second transmission, and the first power member is connected with the bearing section via the second transmission, the mechanical arm further comprises a controller, wherein the controller is configured to record times when the first sensor and the second sensor detect a first side, facing the bearing section, of the rectangular plate, respectively, calculate an offset angle of the rectangular plate, and send a control signal corresponding to the offset angle to the first driver to allow the first driver to drive the bearing section to rotate parallel to the first bearing surface by the offset angle to align the bearing section with the rectangular plate along a direction perpendicular to the first side.

2. The mechanical arm according to claim 1, further comprising a second driver, wherein the second driver is arranged at a second end of the arm main body to be able to drive the arm main body and the bearing section to move.

3. The mechanical arm according to claim 2, wherein the arm main body comprises a first arm and a second arm, the first arm comprises a third end and the first end, the second arm comprises a fourth end and the second end, and the third end of the first arm is movably connected with the fourth end of the second arm.

4. The mechanical arm according to claim 3, further comprising a first transmission, wherein the first transmission is connected with the second driver in a transmission connection to be able to drive the first arm to move.

5. The mechanical arm according to claim 4, wherein the bearing section comprises a main body and a plurality of branch fork rods that are arranged on the main body, the main body is movably connected with the first end, and the plurality of branch fork rods are arranged parallel to the first bearing surface.

6. The mechanical arm according to claim 3, further comprising a third driver, wherein the third driver is arranged on the second arm, and is configured to drive the first arm to move.

7. The mechanical arm according to claim 6, wherein the bearing section comprises a main body and a plurality of branch fork rods that are arranged on the main body, the main body is movably connected with the first end, and the plurality of branch fork rods are arranged parallel to the first bearing surface.

8. The mechanical arm according to claim 7, further comprising a fourth driver, the fourth driver is configured to drive the mechanical arm to move up and down, rotate or translate.

9. The mechanical arm according to claim 2, wherein the bearing section comprises a main body and a plurality of branch fork rods that are arranged on the main body, the main body is movably connected with the first end, and the plurality of branch fork rods are arranged parallel to the first bearing surface.

10. The mechanical arm according to claim 1, wherein the bearing section comprises a main body and a plurality of branch fork rods that are arranged on the main body, the main body is movably connected with the first end, and the plurality of branch fork rods are arranged parallel to the first bearing surface.

11. A mechanical arm device, comprising a base and the mechanical arm according to claim 1, wherein the base is movably connected with a second end of the arm main body.

12. A manufacturing equipment of a display panel, comprising a mechanical arm according to claim 1 to allow the rectangular plate to move.

13. The mechanical arm according to claim 1, wherein the first sensor and the second sensor are arranged on ends of the branch fork rods, wherein the ends of the branch fork rods are away from the first driver, and there is at least one branch fork rod arranged between the branch fork rods on which the first sensor and the second sensor are arranged.

14. The mechanical arm according to claim 1, wherein the alignment device further comprises a third sensor and a fourth sensor, the first sensor and the third sensor are arranged on a same branch fork rod, and the second sensor and the fourth sensor are arranged on another same branch fork rod.

15. An operation method for the mechanical arm according to claim 1, comprising:

moving the bearing section to a base on which the rectangular plate is placed;

rotating the bearing section to allow the bearing section to be aligned with the rectangular plate; and picking up the rectangular plate.

16. The operation method according to claim 15, wherein the first driver drives the bearing section to rotate at least parallel to the first bearing surface to allow the bearing section to be aligned with the rectangular plate.

17. An operation method for the mechanical arm according to claim 1, comprising:

moving the bearing section loaded with the rectangular plate to a base;

rotating the bearing section to allow the bearing section to be aligned with the base; and putting down the rectangular plate.

* * * * *